United States Patent [19]

Miyajima et al.

[11] Patent Number: 4,968,961

[45] Date of Patent: Nov. 6, 1990

[54] SUPERCONDUCTING MAGNET ASSEMBLY WITH SUPPRESSED LEAKAGE MAGNETIC FIELD

[75] Inventors: Goh Miyajima, Katsuta; Kunishige Kuroda, Mito, both of Japan

[73] Assignee: Hitachi, Ltd., Tokyo, Japan

[21] Appl. No.: 235,095

[22] Filed: Aug. 23, 1988

[30] Foreign Application Priority Data

Aug. 26, 1987 [JP] Japan ................. 62-210055

[51] Int. Cl.$^5$ ............................................. H01F 7/22
[52] U.S. Cl. ..................................... 335/216; 335/301; 324/320
[58] Field of Search ................... 335/216, 299, 301; 505/1; 324/318, 319, 320

[56] References Cited

U.S. PATENT DOCUMENTS

| 4,587,504 | 5/1986 | Brown et al. | 335/216 |
| 4,797,646 | 1/1989 | Saji et al. | 335/301 |
| 4,803,452 | 2/1989 | Saji et al. | 335/301 |

FOREIGN PATENT DOCUMENTS

| 62-5161 | 1/1987 | Japan | 335/301 |
| 169311 | 7/1987 | Japan | 335/301 |
| 2203909 | 10/1988 | United Kingdom | 335/301 |

Primary Examiner—George Harris
Attorney, Agent, or Firm—Antonelli, Terry, Stout & Kraus

[57] ABSTRACT

A superconducting magnetic assembly has a first superconducting coil for generating a magnetic field in an internal magnetic space in the first superconducting coil, a pair of second superconducting coils one provided at each end of the first superconducting coil for generating a cancelling magnetic field counteracting a leakage magnetic field leaking from the magnetic field in the internal space, and a magnetic shield of a superconducting material surrounding the first superconducting coil so as to be open to the internal space.

8 Claims, 4 Drawing Sheets

SUPERCONDUCTING MAGNET ASSEMBLY WITH SUPPRESSED LEAKAGE MAGNETIC FIELD

BACKGROUND OF THE INVENTION

The present invention relates to a superconducting magnet assembly of a structure in which leakage of a magnetic field can be suppressed successfully. More particularly, the invention is concerned with an active shielding type superconducting magnet (SCM) assembly.

As an example of the apparatus to which the present invention can be applied, mention is made of a magnetic resonance imaging apparatus (also simply referred to as MRI). In such an MRI apparatus, it is desirable to provide magnetic shielding such that the leakage of the magnetic field of the SCM assembly incorporated therein is confined as much as possible within the space in which the SCM is installed. For example, a pacemaker implanted in a patient with heart disease may be adversely influenced due to the leakage of the magnetic field. Most of the SCM assemblies used conventionally are of a self-magnetic shielding type. As is disclosed in U.S. Pat. No. 4,587,504 to Brown et al (issued May 6, 1985 and corresponding to JP-A-62-123756) and JP-A-62-5161 laid open on Jan. 12, 1987, the active shielding type SCM assembly is certainly advantageous over the self-shielding system realized with the aid of sheet iron in the respect that the former can be implemented having a lighter weight.

By way of example, in the case of an exemplary application in which the intensity of a static magnetic field ($H_o$) generated within an internal magnetic space of a main coil of the SCM assembly is 1.5 T (Tesla), the iron material required for the self-shielding system amounts to about 30 to 60 tons, thus involving considerable difficulty in the installation of the self-shielding system. In contrast, the active shielding system requires no iron material and may provide a SCM assembly on a scale of 10 tons or less. Accordingly, it is expected in the future that the active shielding system will be increasingly employed as the magnetic shielding of the SCM in view of the increasing demand for a higher intensity static field ($H_o$). The conventional, active shielding systems however are not considered to be satisfactory with regard to the items mentioned below.

Reference is made to FIG. 1 of the accompanying drawings which shows schematically a cross-section of an active shielding type SCM assembly. As will be seen in this figure, a superconducting (SC) cancel coil 2 is coaxially installed on a superconducting (SC) main coil for the purpose of generating a magnetic field having a direction opposite to that of the abovementioned static field ($H_o$). Hence, the effective static field ($H_o$) is given by $$H_o = A - a \quad (1)$$

(wherein A represents the intensity of magnetic field generated by the SC main coil 1, and a represents the intensity of the opposite magnetic field generated by the SC cancel coil 2).

Thus, it will be understood that for generating a given intensity of the static magnetic field ($H_o$), the SC main coil 1 is necessarily of a considerably large structure when compared with the system in which no active shielding system is adopted (i.e. a=0). The SC cancel coil 2 is also of relatively massive structure. For these reasons, the following problems are;

(i) The diameter of the SCM assembly is increased as a whole, involving a corresponding increase in the height of the SCM assembly which depends on the diameter (e.g. height of 30 to 40 cm in the case of a SCM assembly of 0.5 T). As a result, the SCM assembly can no larger be accommodated within an ordinary chamber or room (having a ceiling height of 2.4 to 2.7 m). In other words, a limitation is imposed on the environmental conditions for the installation of the SCM assembly More specifically, a room having a higher ceiling is required for installing the SCM system.

(ii) When compared with the, SCM assembly without the provision of the active shielding system, at least double the amount of expensive superconducting wire material is required, involving high costs in manufacturing the SCM assembly, which presents of course an obstacle to extensive utilization of the SCM system.

In FIG. 1, a reference numeral 3 denotes an internal magnetic space formed in the main coil 1 in which the static magnetic field ($H_o$) is generated, 4 denotes a hermetically sealed cylindrical casing which may be made of, for example, stainless steel, 5 denotes a vessel for liquid helium, 6 denotes a vessel for liquid nitrogen, 7 denotes a bore defining the abovementioned internal magnetic space, A' and A" represent the leakage magnetic fields of the superconducting (SC) main coil, a' and a" represent the leakage magnetic fields of the superconducting (SC) cancel coil 2, LHe represents liquid helium, and $LN_2$ represents liquid nitrogen.

As will be seen from the foregoing description, no consideration is given to the environmental condition for installation of the active shielding type SCM system which is too tall and is expensive.

JP-A-62-169311 laid open on July 25, 1987 discloses a structure in which a cage-type porous superconducting (SC) shielding is provided so as to enclose a SC main coil for suppressing generation of the leakage magnetic field.

SUMMARY OF THE INVENTION

An object of the present invention is to provide a superconducting magnet (SCM) assembly which can be implemented in a smaller size than the prior art assembly while ensuring more effective suppression of the leakage magnetic field. magnetic field.

According to an aspect of the present invention, the main coil of the SCM assembly is covered with a magnetic shielding made of a superconducting material and exhibiting perfect diamagnetism, and additionally a pair of cancel coil units are installed at both ends of the SCM main coil, respectively.

The magnetic shield made of the superconducting material and exhibiting perfect diamagnetism is effective in reducing the leakage magnetic field (A") in the diametrical direction of the SCM main coil to such an extent that the cancel coil means are taken out of the role of suppressing the leakage magnetic field (A"). On the other hand, the magnetic field leaking externally through the space (an internal magnetic space) in which the magnetic field is generated, i.e. the magnetic field leaking outside of the SCM can be cancelled out by the opposing magnetic fields generated by the cancel coil units installed at both ends of the main coil means, respectively Since the cancel coil units are positioned at both axially opposite ends of the main coil means as viewed along the direction of magnetic flux of the static field generated within the internal magnetic space and because they can each be realized each in a small size, the opposing magnetic fields are of only a low intensity within the internal magnetic space, which in turn means that the main coil means can also be implemented in a relatively small size Thus, there can be obtained the following advantages:

1. The active shielding type SCM can be implemented with a decreased diameter which allows the associated MRI to be easily installed within a room of ordinary size (2.4 to 2.7 m in height of the ceiling) with significant reduction in the costs involved in the installation.

2. The active shielding type SCM can be manufactured very inexpensively due to a significant reduction in the amount of expensive SC wire material

DESCRIPTION OF THE PREFERRED EMBODIMENT

Figure 1:
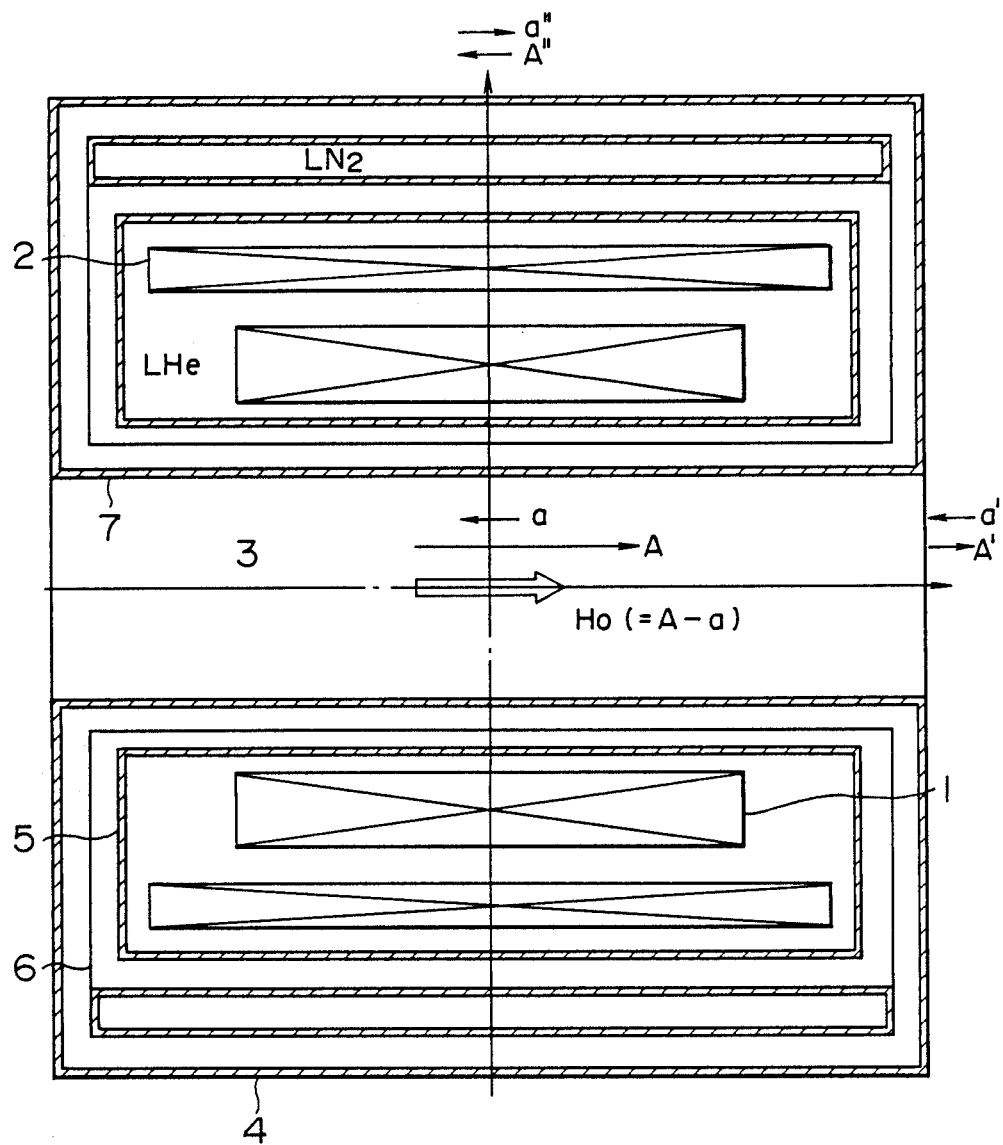
FIG. 1 is a longitudinal sectional view showing a structure of an active shielding type SCM known in the art.
Figure 2:
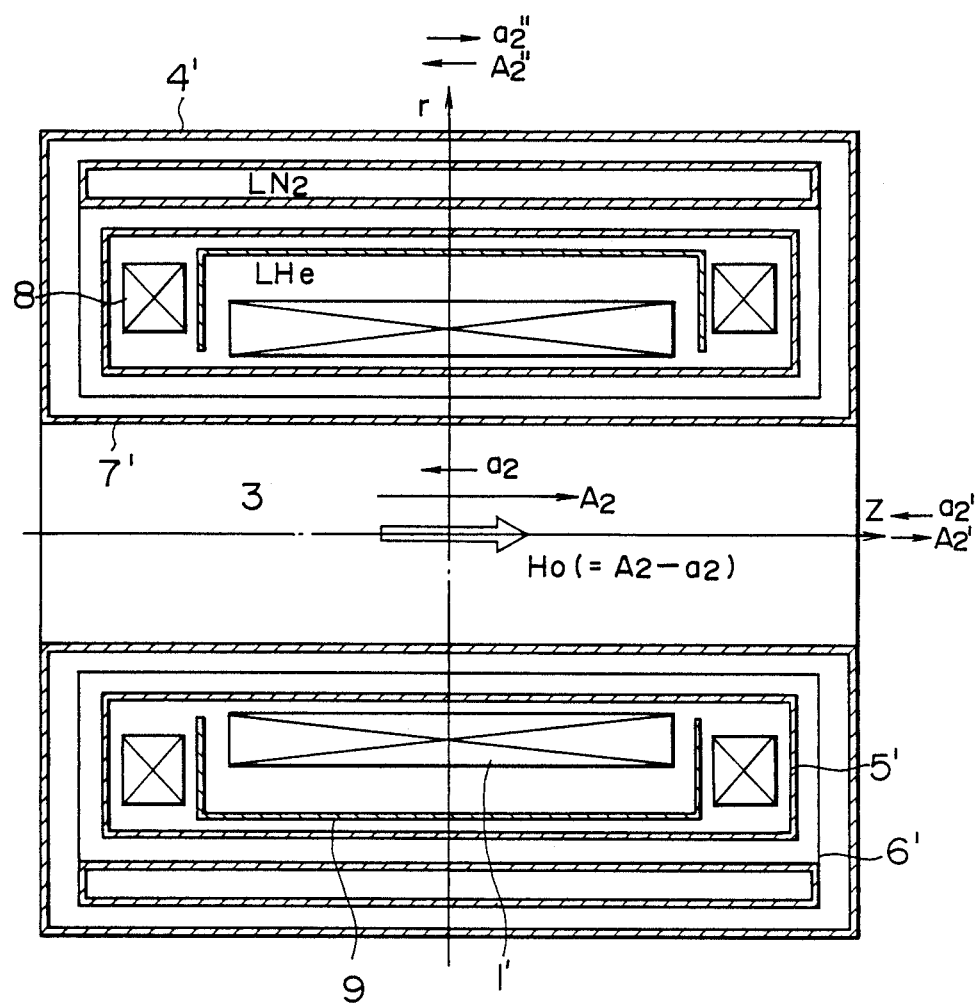
FIG. 2 is a longitudinal sectional view showing a structure of an active shielding type SCM according to an embodiment of the present invention.

FIG. 2 is a sectional view of a superconducting magnetic coil assembly (SCM) according to an exemplary embodiment of the present invention which can be implemented in the active shielding type structure. The SCM assembly shown in FIG. 2 often finds its application in the magnetic resonance imaging apparatus or MRI as the magnetic field generating means therefor. The superconducting (SC) main coil unit 1' may be formed from a superconducting wire material such as, for example, a material of Nb-Ti alloy series In many cases, the superconducting main coil unit 1' is composed of plural (e.g. two to six) ring-like subunits with a view to enhancing the homogeneity or uniformity of the magnetic field.

For allowing the Nb-Ti wire to maintain the superconducting state and continue to flow a permanent current therethrough, the SC main coil unit 1' is fixedly mounted within a ring-like tube 5' filled with liquid helium (hereinafter simply referred to as LHe) at a temperature of 4.2 K in the state totally immersed in LHe. For decreasing the rate of vaporization of LHe, a ring-like tube 6' filled with liquid nitrogen (also referred to simply as $LN_2$) at a temperature of 77 K is installed around the LHe tube 5' for keeping the environment of the LHe tube 5' at a low temperature of 77 K. Further, in order to suppress the penetration of heat from the room atmosphere as far as possible, the tubes 5' and 6' are accommodated within a hermetically sealed cylindrical case 4', the interior of which is maintained under vacuum on the order of $10^{-6}$ Torr and isolated from the exterior through the medium of superinsulation. It should however be noted that a magnetic field generation space (an internal magnetic space) 3 is defined by a bore 7' of a cylinder made of a glass-reinforced plastic (FRP) material at the center of the case 4'. In FIG. 2, injection and vaporization ports of $LN_2$ and LHe which bear no critical relevance to the present invention are omitted from illustration for simplification thereof.

A magnetic shield 9 made of a superconducting material and placed in the state totally immersed in LHe covers the SC main coil unit 1' in such arrangement that the coil unit 1' is exposed from the magnetic shield 9 only in the direction confronting the magnetic field space. With this arrangement, the leakage magnetic field component $A_2''$ in the radial direction (r) of the magnetic field generated by the main coil unit 1' is confined within the magnetic shield 9 under the shielding action due to the perfect diamagnetism thereof, as a result of which intensity of the leakage magnetic field $A_2''$ is remarkably reduced On the other hand, the leakage magnetic field $A_2'$ leaking through the magnetic field generating space 3 in the direction Z to the emvironmental space enclosing the SCM is significantly decreased under the effect of the magnetic fields $a_2'$ of the opposing directions produced by a pair of cancel coil units 8 installed on both sides of the SC main coil unit 1', respectively. In other words, $A_2' - a_2' \delta 0$.

The cancel coil unit 8 may be formed from a superconducting wire of a Nb-Ti material. The configuration of the cancel coil unit 8 is also of a ring-like shape as in the case of the main coil unit 1'. The cancel coil is immersed in LHe in order to maintain the Nb-Ti wire thereof in the superconducting state thereby allowing a permanent current to continue to flow therethrough as in the case of the main coil unit 1'. The direction of the permanent current flowing through the Nb-Ti wire of the cancel coil unit 8 is opposite to that of the permanent current flowing through the main coil unit 1'.

As will be understood from the foregoing description, although the effectiVe magnetic field $H_o$ as required is given by $$H_o = A_2 - a_2$$

(wherein $A_2$ represent the main magnetic field generated by the main coil unit 1' and $a_2$ represents the opposing magnetic field generated by the cancel coil units 8), the opposing magnetic field $a_2$ is of significantly smaller intensity than that of the counter acting magnetic field a in the prior art SCM (i.e. $a - a_2 >> 0$). Accordingly, the main coil unit 1' can be implemented in a smaller size than that in the prior art SCM assembly It is further noted that the leakage magnetic field $A_2''$ is cancelled by the opposing magnetic field $a_2''$ (i.e. $A_2'' - a_2'' \delta 0$).

Figure 4:
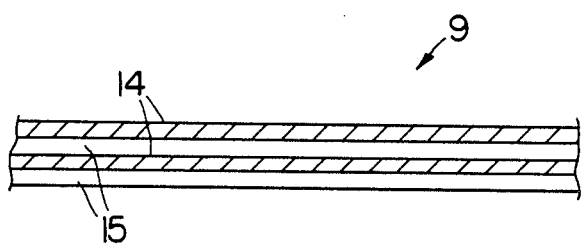
FIG. 4 shows a partial cross-sectional view of an embodiment of the magnetic shield 9 of FIG. 2.

Parenthetically, the magnetic shield 9 may be implemented in such a form to encircle therein substantially the main coil 1' so long as the latter is exposed toward the space 3. By way of example, the magnetic shield 9 may be realized in the form of a cylinder having circular flanges formed at both ends and extending radially inward. In that case, the cancel coil unit 8 is disposed outside of the magnetic shield 9. Further, the magnetic shield 9 may be realized in the form of a single layer of a superconducting material or a multi-layer structure including a plurality of thermal conductive layers 15 and a plurality of superconducting layers 14 laminated alternately with each other as illustrated in FIG. 4. As the typical thermal conductive material, Cu or Al may be mentioned, by way of example. The superconducting material may be, for example, a Nb-Ti alloy.

The cancel coil units 8 may typically be disposed substantially coaxially with the main coil unit 1'.

Figure 3:
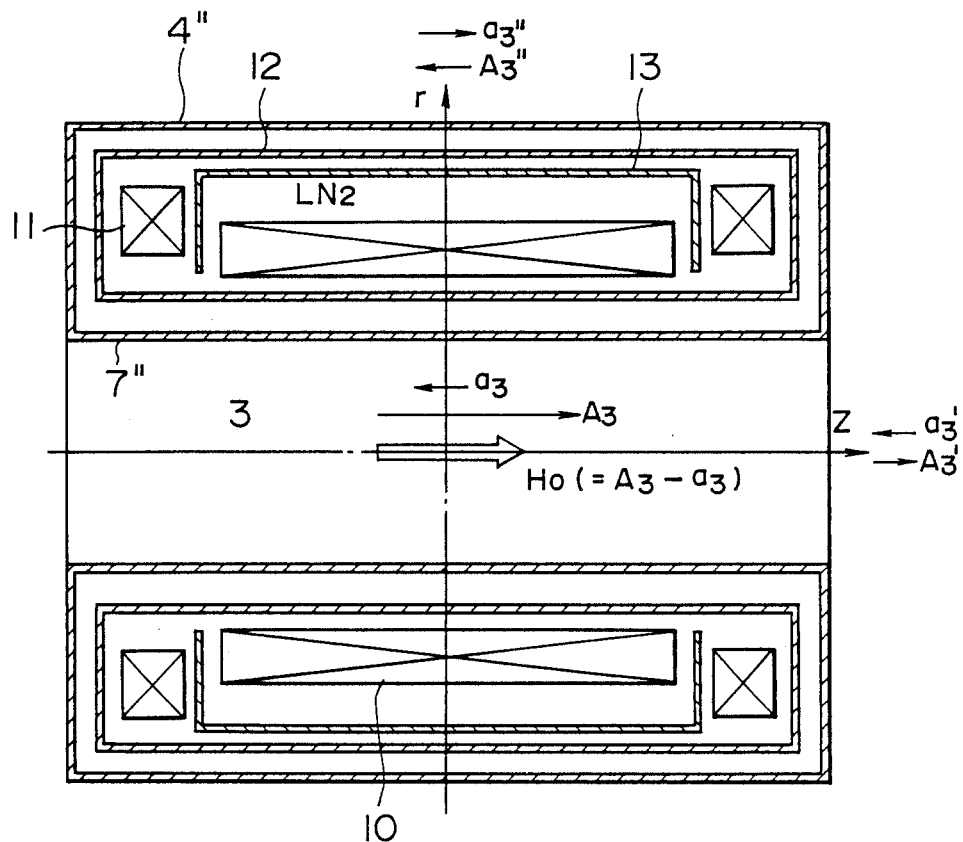
FIG. 3 shows a longitudinal section of an active shielding type SCM according to another embodiment of the invention.

FIG. 3 shows another preferred embodiment of the present invention.

The SCM assembly shown in FIG. 3 differs from that shown in FIG. 2 in that the superconducting material is a high-temperature superconducting ceramic having a superconduction transit point of about 90 K as typified by a material of Y - Ba - Cu - 0 series which need not be cooled by LHe. Accordingly, LHe is not employed for the cooling purpose, but $LN_2$ is used at the temperature of 77 K. The main coil unit 10 formed of the high temperature superconducting material is disposed within a tube 12 filled with $LN_2$ to be immersed therein and equipped with a pair of high-temperature superconducting cancel coil units 11 and a high-temperature superconducting magnetic shield 13 in the arrangement similar to that shown in FIG. 2. Actions and effect of the components 10, 11 and 13 are virtually the same as those of the corresponding components shown in FIG. 2. The magnetic field $A_3$ generated by the main coil unit 10 is enfeebled by the opposing magnetic fields $a_3$ generated by the cancel coil units 11. The effective magnetic field $H_o$ within the magnetic field generation space (the internal magnetic space) 3 is given by $$H_0 = A_3 - a_3$$

Since the opposing magnetic fields $a_3$ are of much smaller intensity than that of the prior art indicated by a (i.e. $a - a_3 >> 0$), the main coil unit 10 according to the instant embodiment can be implemented in a reduced size.

The magnetic field $A_3'$ leaking from the magnetic field generating space 3 is remarkably decreased by the magnetic fields $a_3'$ generated by the cancel coils 11 (i.e. $A_3' - a_3 \delta 0$). Since the magnetic flux generated by the main coil unit 10 and tending to leak in the diametrical direction r is repulsed toward the center of the main coil unit 10 under the action of the magnetic shield 13, the leakage magnetic field $A_3''$ is significantly reduced and cancelled out by the opposing magnetic fields $a_3''$ generated by the cancel coil units 11, (i.e. $A_3'' - a_3'' \delta 0$). The tube 12 filled with $LN_2$ is housed within a hermetically sealed cylinder 4" (having a center bore 7" defined by a FRP cylinder 7), the tube 12 defining the magnetic field generating space 3. Pouring port and vaporization port for $LN_2$ are omitted from illustration in FIG. 3 for simplification.

Geometrical configuration, structure and disposition of the magnetic shield 13 and the cancel coil unit 11 may be same as or similar to those of the magnetic shield 9 and the cancel coil unit 8 shown in FIG. 2.

What is claimed is:

1. A superconducting magnet assembly with suppressed leakage magnetic field, comprising:
   first superconducting coil means for providing an internal magnetic space therein and generating a first magnetic field in said internal space;
   magnetic shield means having a superconducting material exhibiting perfect diamagnetism arranged to cover said first superconducting coil means and to be open to said internal space for enabling generation of said first magnetic field in said internal space by said first superconducting coil means, said first magnetic field undesirably leaking through said internal space to cause a leakage magnetic field to appear in an external space surrounding the superconducting magnet assembly; and
   second superconducting coil means including a pair of superconducting coil units, said superconducting coil units being located at first and second end portions, respectively, of said first superconducting coil means as viewed in a direction parallel with the direction of magnetic flux for said first magnetic field in said internal space for generating a second magnetic field in said external space, the polarity of said second magnetic field being opposite to that of said first magnetic field.

2. An assembly according to claim 1, in which said magnetic shield means has such a shape as substantially surrounding said first superconducting coil means.

3. An assembly according to claim 2, in which said magnetic shield means is of a cylindrical shape with flanges at its opposing ends inwardly extending, and said second superconducting coil means is outside said cylindrical magnetic shield means.

4. An assembly according to claim 1, in which said second superconducting coil means is substantially coaxial with said first superconducting coil means.

5. An assembly according to claim 1, in which said magnetic shield means is in a multilayer structure having thermally conductive layers and superconducting layers laminated alternately.

6. A superconducting magnet assembly with suppressed leakage magnetic field, comprising:
   first superconducting coil means for providing an internal magnetic space therein and for generating a first magnetic field in said internal space, said first magnetic field undesirably leaking through said internal space to cause a leakage magnetic field to appear in an external space surrounding the superconducting magnet assembly;
   second superconducting coil means including a pair of superconducting coil units located at first and second end portions, respectively, of said first superconducting coil means as viewed in a direction parallel with the direction of magnetic flux for said first magnetic field in said internal space, for generating a second magnetic field in said external space, the polarity of said second magnetic field being opposite to that of said first magnetic field; and magnetic shield means having a superconducting material exhibiting perfect diamagnetism and arranged to cover said first superconducting coil means and to be open to said internal space to enable generation of said first magnetic field in said internal space by said first superconducting coil means, said magnetic shield means at least suppressing the leakage magnetic field produced by said first superconducting coil means in a radial outward direction with respect to said first superconducting coil means thereby eliminating a need for an additional superconducting coil located radially outward from said first superconducting coil.

7. A superconducting magnet assembly in accordance with claim 6, wherein said magnetic shield means includes portions disposed between the first and second end portions of said first superconducting coil means and the pair of superconducting coil units.

8. A superconducting magnet assembly in accordance with claim 1, wherein said magnetic shield means includes portions disposed between said first and second end portions of said first superconducting coil means and the pair of superconducting coil units.

* * * * *